United States Patent
Bots

(10) Patent No.: US 6,637,007 B1
(45) Date of Patent: Oct. 21, 2003

(54) SYSTEM TO LIMIT MEMORY ACCESS WHEN CALCULATING NETWORK DATA CHECKSUMS

(75) Inventor: Henk J. Bots, Sunnyvale, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 0 days.

(21) Appl. No.: 09/561,435

(22) Filed: Apr. 28, 2000

(51) Int. Cl.[7] .............................................. H03M 13/09
(52) U.S. Cl. ....................................... 714/805; 714/807
(58) Field of Search ................................. 714/805, 807

(56) References Cited

U.S. PATENT DOCUMENTS

| | | | |
|---|---|---|---|
| 4,937,763 A | | 6/1990 | Mott ........................... 364/550 |
| 5,067,099 A | | 11/1991 | McCown et al. ............ 364/550 |
| 5,479,654 A | * | 12/1995 | Squibb ......................... 707/201 |
| 5,500,864 A | * | 3/1996 | Gonia et al. ................. 714/807 |
| 5,687,314 A | * | 11/1997 | Osman et al. ................. 714/49 |
| 5,719,885 A | * | 2/1998 | Ofer et al. ...................... 714/6 |
| 5,951,707 A | * | 9/1999 | Christensen et al. ........ 714/752 |
| 6,076,084 A | * | 6/2000 | Harlan ........................... 707/1 |
| 6,289,023 B1 | * | 9/2001 | Dowling et al. ............. 370/419 |
| 6,412,092 B1 | * | 6/2002 | Raghunath ................... 714/807 |

FOREIGN PATENT DOCUMENTS

EP 0537098 4/1993

* cited by examiner

Primary Examiner—Stephen M. Baker
(74) Attorney, Agent, or Firm—Swernofsky Law Group PC

(57) ABSTRACT

The invention provides a method and process for transmitting data without using additional CPU cycles and memory accesses to calculate checksums. The transmitting device obtains data from an internal or external data source and stores that data in memory. The data is then divided into zones and checksums are calculated for each zone. The checksums are recorded on a checksum array. A data pointer containing an address for the data stored in memory, a description of the data and an address for the checksum array is transferred through data transfer protocol to network and transmission layers. The network and transmission layers are then able to access and send the data without having to either copy the data through data transfer protocol to network and transfer layers or read all of the data to calculate the checksums. This method and process uses fewer CPU cycles and memory accesses to transmit data and is, therefore, more efficient than the prior art.

21 Claims, 4 Drawing Sheets

SYSTEM TO LIMIT MEMORY ACCESS WHEN CALCULATING NETWORK DATA CHECKSUMS

BACKGROUND OF INVENTION

1. Field of the Invention

This invention relates to the transmission of data through a communications network and incorporates a unique process for calculating data checksums.

2. Related Art

In computer networks, data is often transmitted from one computer to another using a data transfer protocol. Some of the major protocols in use include Open Systems Interconnection (OSI), Transfer Control Protocol/Internet Protocol (TCP/IP), Decnet, Telnet, XNS, IPX, AppleTalk and others. The invention is intended to work with protocols now in existence or protocols which may be developed in the future, but the invention is particularly useful when the protocol uses a checksum which may be defined to allow transfer of data in small pieces.

The transmitting computer obtains the data to be transmitted from a data source (such as a hard disk, DMA or other source) and caches the data in memory. The data is then copied from the application layers to the network layers and ultimately transmitted to the communications network.

One problem is that copying the data through a data transfer protocol takes numerous CPU cycles and memory accesses and, thus, slows the transmission process. A method that is sometimes used to avoid copying the data through data transfer protocol is creating a data pointer 114 in the application layer and sending that pointer to the network and transmission layers instead of copying the data itself. Fewer CPU cycles and memory accesses are used to transmit the data pointer 114 than to copy the data itself. The network layers use the data pointer 114 to locate the data cached in memory and transmit it through the communications network.

One problem with the method of using a data pointer 114 to speed up the transmission process is that it is that much of the efficiency of transferring the data pointer 114 is lost when the transport layer subsequently needs to read all the data to calculate the checksum. It takes fewer CPU cycles and memory accesses to transfer a data pointer 114 than to copy data through protocol. But CPU cycles and memory accesses are required to read the data cached or stored in memory in order to calculate the checksums. Thus, the economy otherwise gained by transferring a data pointer 114 instead of copying data is diminished because the CPU cycles and memory accesses are required to read the data to calculate the checksums.

SUMMARY OF THE INVENTION

The invention provides a method and process for transmitting data using fewer CPU cycles and memory accesses to calculate checksums. The transmitting device obtains data from an internal or external data source and stores that data in memory. The data is then divided into fixed sized zones and checksums are calculated for each zone. The checksums are recorded on a checksum array 115. A data pointer 114 containing an address for the data stored in memory, a description of the data and an address for the checksum array 115 is transferred through data transfer protocol to the network and transmission layers. The network and transmission layers are then able to access and send the data without having to copy or read all of the data to calculate the checksums. This method and process uses fewer CPU cycles and memory accesses to transmit data and is, therefore, more efficient than the prior art.

DETAILED DESCRIPTION OF THE PREFERRED EMBODIMENT

In the following description, preferred and alternative embodiments of the invention are described with regard to process steps and data structures. Embodiments of the invention can be implemented using general-purpose processors or special-purpose processors operating under program control, or other circuits, adapted to particular process steps and data structures described herein. Implementation of the process steps and data structures described herein would not require undue experimentation or further invention.

System Elements

Figure 1:
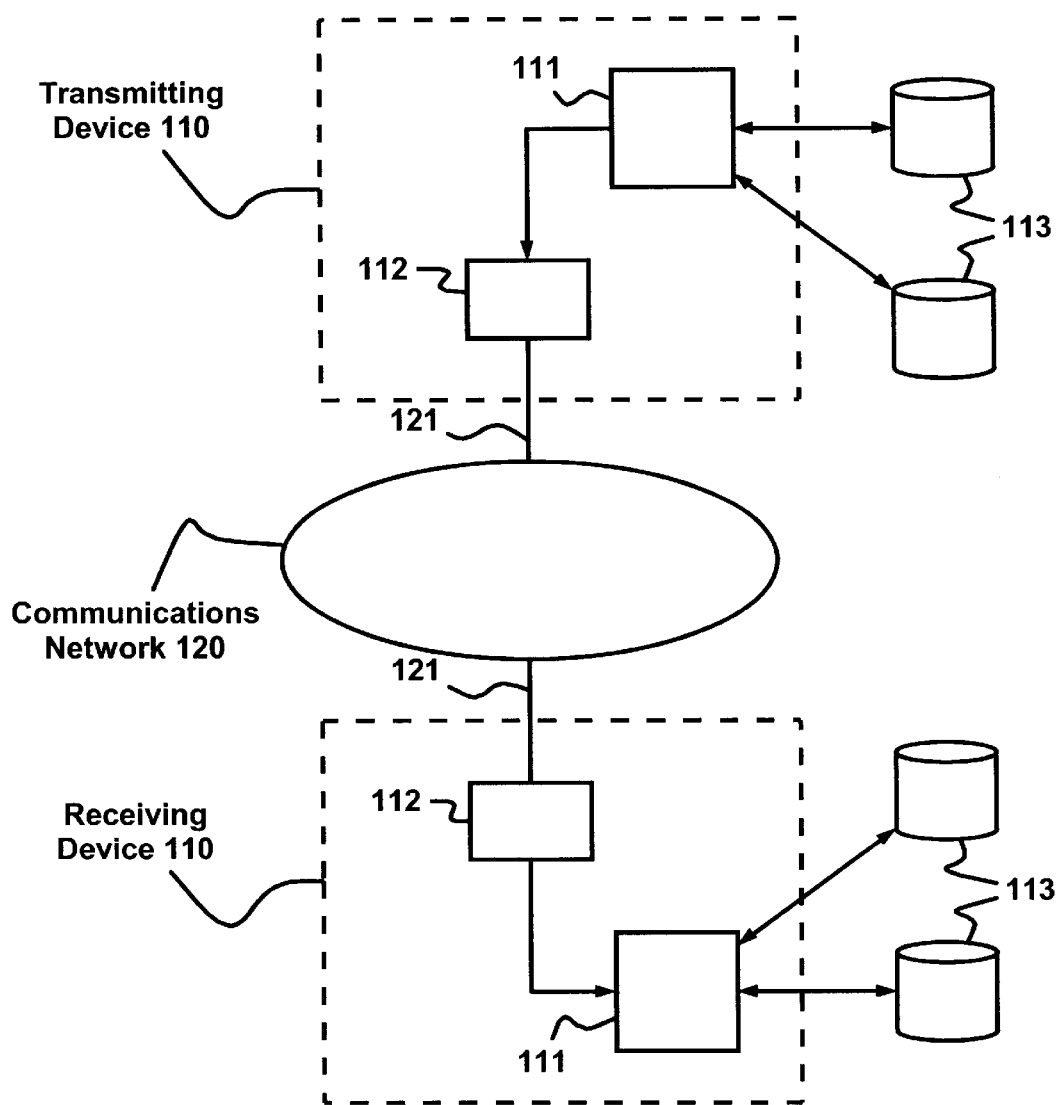
FIG. 1 shows a block diagram of a system for transmitting data across a network.

FIG. 1 shows a block diagram of a system for transmitting data across a network.

A system 100 includes two or more data transmission devices 110 (such as a computer). In a preferred embodiment, the transmission devices 110 are capable of both transmitting and receiving data at any given time. For the purpose of explanation, when a transmission device is transmitting data, it will be referred to as a "transmitting device" and when it is receiving data, it will be referred to as a "receiving device". The system also includes a communication network 120, and two or more communication links 121, which link the data transmission devices to the communication network 120.

The data transmission devices 110 include a processor, operational software, data memory 111, and a network interface card 112. The transmission devices 110 are linked either internally or externally to one or more data storage devices (such as a DMA or disk drive) 113.

In a preferred embodiment, the communication network 120 includes an Internet, intranet, extranet, virtual private network, enterprise network, or another form of communication network. In the preferred embodiment, the communication network 120 is a network capable of routing messages between and among one or more transmission devices. However, there is no particular requirement that the communication network 120 comprise an actual network, so long as the communication network 120 includes at least some technique for communication between the transmitting and receiving devices 110.

The transmitting device 110 obtains data from one or more data storage devices and stores (or "caches") that data in memory 111. The data is then sent from the memory 111 to the network interface card 112. The data is then sent from the network interface card 112 to the communication network 120 via the communication link.

The data travels from the communication network to the network interface card of the receiving device 110 via a communication link 121. The data is then sent from the network interface card to the memory 111 and ultimately stored on one or more storage device(s) 113.

Figure 2:
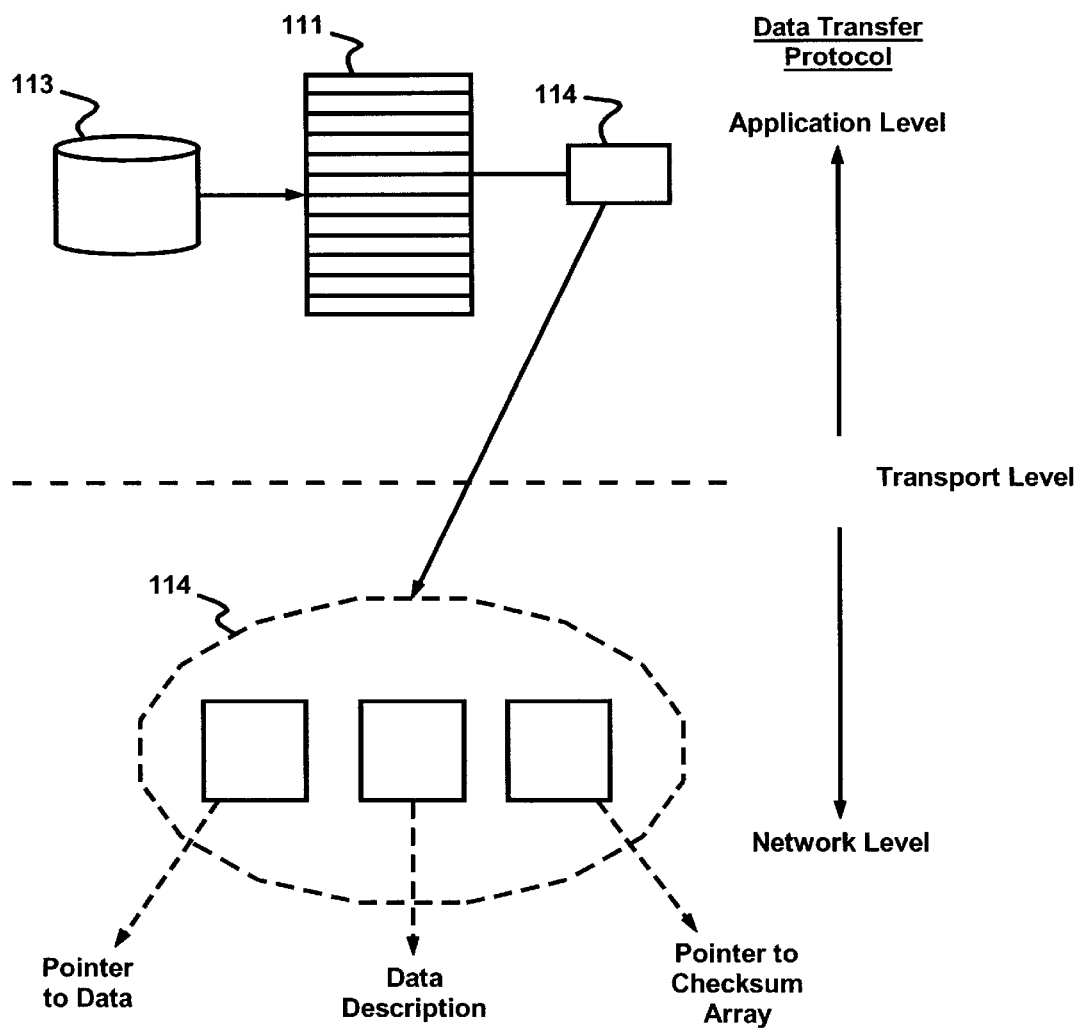
FIG. 2 shows a block diagram of a system for transmitting a data pointer 114 pointing to the checksum array 115 from an application level through a data transfer protocol to a network level.

FIG. 2 shows a block diagram of a system for transmitting a data pointer 114 containing an address for the data, a description of the data and an address for the checksum array 115 from an application layer through data transfer protocol to network and transmission layers of the transmitting device 110.

Data transfer protocols describe how information from a software application in one computer moves through a network medium to a software application in another computer. Some of the major protocols in use include Open Systems Interconnection (OSI), Transfer Control Protocol/Internet Protocol (TCP/IP), Decnet, Telnet, XNS, IPX, AppleTalk and others. The invention is also intended to work with data transfer protocols now in existence or protocols which may be developed in the future, but the invention is particularly useful when the protocol uses a checksum which may be defined to allow transfer of data in small pieces.

In the OSI model, for example, information being transferred from a software application in one computer system to a software application in another must pass through each of the seven (7) OSI layers. For the purposes of this application, the seven (7) layers can be apportioned between those layers having more to do with the application and those layers having more to do with the network. Other data transfer protocols, such as TCP/IP, are concerned primarily with the lower network layers of the OSI chain. These two general areas are divided by a transmission layer where the data is transmitted to the network communication system via the data communication link 121.

As information is transferred from a data source 113 to memory 111 or from one layer to another, the transmission device must check to make sure the integrity of the data remains intact (i.e. all the bytes of data are transferred in the correct order). This is done through the use of a checksum.

In the preferred invention, data is obtained from the data source 113 and stored (or cached) in memory 111. The data is divided into a series of zones, each containing between 256 and 512 bytes of data. A checksum is calculated for data stored in each of the zones. A checksum array 115 containing the checksums for the stored data is created and stored in memory. A data pointer 114 containing an address of where the data is being stored in memory, a description of the data and an address of where the checksum array 115 is being stored in memory is transmitted to the network and transmission layers.

Figure 3:
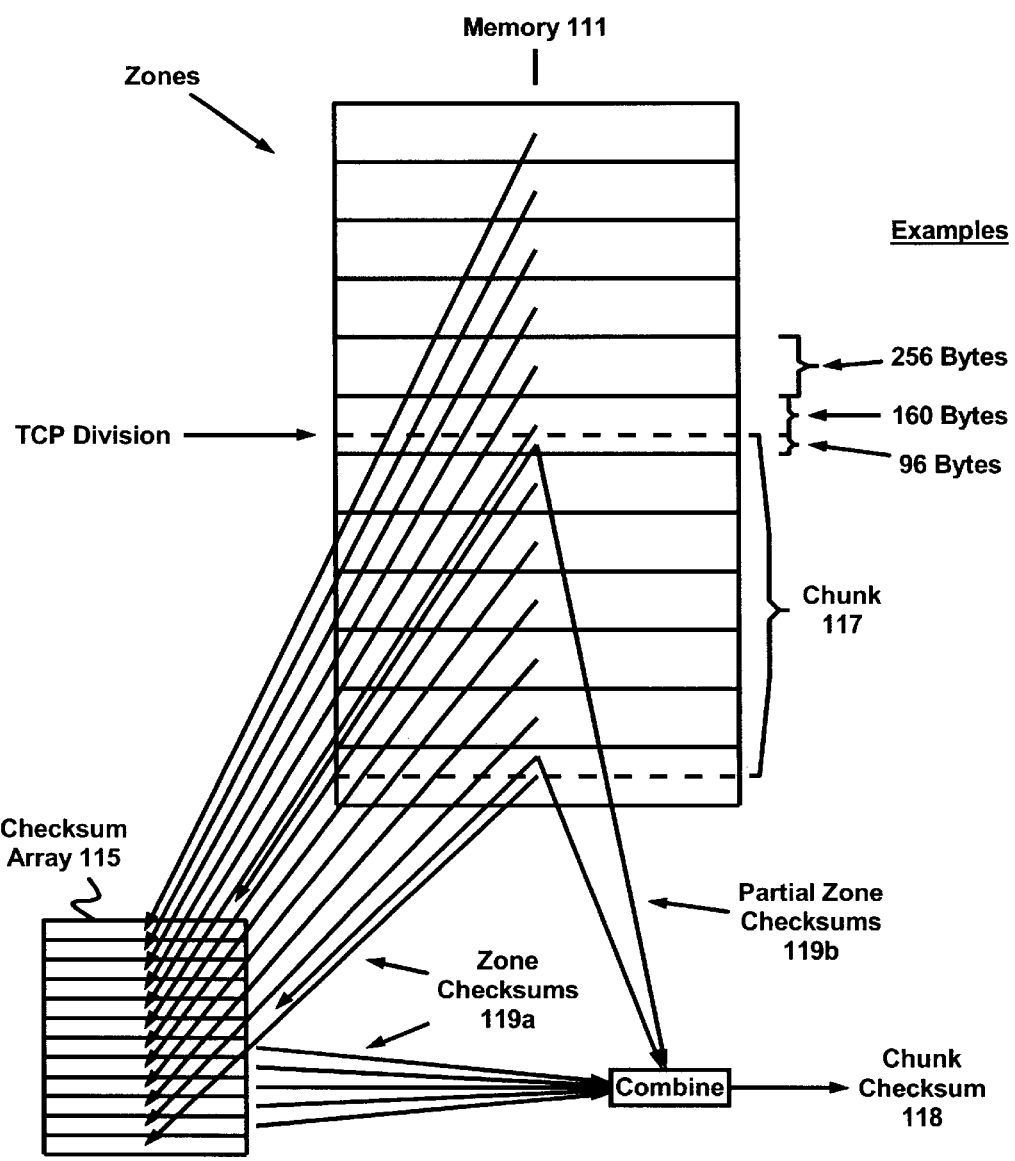
FIG. 3 shows a block diagram of a system for calculating the data checksum without reading all of the data to be transmitted.

FIG. 3 shows a block diagram of a system for calculating the data checksum without reading all of the data stored in memory and which is to be transmitted to a receiving device.

As stated above, a block of we data held in memory is divided into fixed sized zones, a checksum is calculated for each zone, and an array 115 is created and stored in memory which contains the checksums. The checksums can be associated with each zone as represented by the arrows from zones in memory 111 to checksum array 115. During the transmission process, the data transfer protocol divides the data into portions (i.e., partial blocks) such as chunk 117. Each chunk is transmitted via the transmission layer. The data transfer protocol will not necessarily divide the data according to zones and may split one or more zones.

Figure 4:
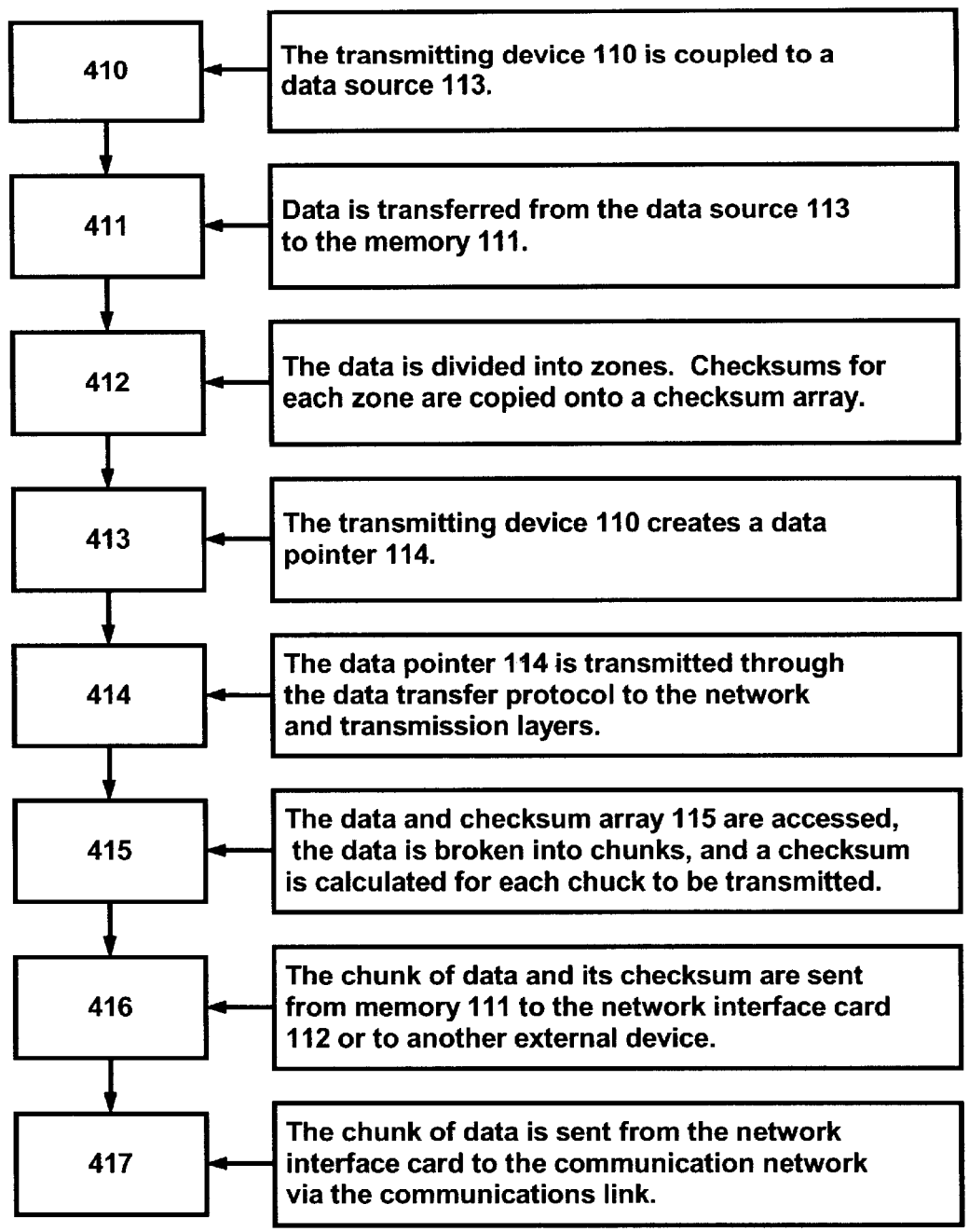
FIG. 4 shows a process flow diagram of a preferred method for transmitting data from a data source to a network interface card.

FIG. 4 shows a process flow diagram of a preferred method for transmitting data from a data source to a network interface card.

At a flow point 410, the transmitting device 110 is coupled to a data source 113, and is ready to transmit data to the receiving device 110 via the communication network 120 and communication link 121.

At a step 411, data is transferred from the data source 113 to the memory 111.

At a step 412, the data transfer protocol divides the data held in memory into zones of a certain length (preferably 128, 256 or 512 bytes) and calculates a checksum for each zone. The checksums are copied onto a checksum array 115.

At a step 413, the transmitting device creates a data pointer 114 which includes an address for the data stored in memory, a description of the data stored in memory, and the address of the checksum array 115.

At a step 414, the data pointer 114 is transmitted down through data transfer protocol to the network and transmission layers.

At a step 415, the data and checksum array 115 are accessed by the network and transmission layers, the data is broken into chunks and a checksum is calculated for each chunk to be transmitted using the checksum array 115.

At a step 416, the chunk of data to be transmitted and its checksum are sent from memory to the network interface card or some other external device.

At a step 417, the chunk of data to be transmitted is sent from the network interface card to the communication network 120 via the communications link 121.

Generality of the Invention

The invention has general applicability to various fields of use, not necessarily related to the services described above.

Other and further applications of the invention in its most general form, will be clear to those skilled in the art after perusal of this application, and are within the scope and spirit of the invention.

Alternative Embodiments

Although preferred embodiments are disclosed herein, many variations are possible which remain within the concept, scope, and spirit of the invention, and these variations would become clear to those skilled in the art after perusal of this application.

What is claimed is:

1. A method, including steps of
   determining a set of zones within a block of data;
   calculating a zone checksum value for each zone within said set of zones;
   recording said zone checksum value for each zone in association with said block of data;
   determining a block portion checksum value for a portion of said block in response to at least one of said zone checksum values for each zone; and
   sending said block and a result of said steps of determining to a Network Interface Card (NIC).

2. A method as in claim 1, wherein said steps of determining a block portion checksum value include determining a partial zone checksum value for at least one said zone; and
   combining said partial zone checksum value with at least one zone checksum value for said set of zones within said block of data.

3. A method as in claim 1, wherein said steps of determining a block portion checksum value include determining at least one said zone for which to compute a partial zone checksum value;

determining said partial zone checksum value in response to a selected portion of said zone; and combining said partial zone checksum value with at least one zone checksum value for said set of zones within said block of data.

4. A method as in claim 1, including steps of receiving said block of data from a storage medium.

5. A method as in claim 1, including steps of sending said block of data and a result of said step of determining a block portion checksum value to an external device.

6. A method as in claim 1, including steps of sending a pointer to said block of data and said associated checksum values for each zone from a first software element to a second software element.

7. A method as in claim 6, wherein said first software element and said second software element are associated with differing layers in a data transfer protocol.

8. Apparatus including memory including a block of data, said block of data being separable into a set of zones;

memory including a zone checksum value for each said zone;

memory including an association of said zone checksum value with each said zone; and memory including a block portion checksum value for a portion of said block, said checksum value for a portion of said block including a combination of at least one of said zone checksum values; and a Network Interface Card (NIC) that receives said block of data and said combination of said zone checksum values from said memory.

9. Apparatus as in claim 8, including memory including a partial zone checksum value for at least one said zone; and memory including a combination of said partial zone checksum value with said zone checksum value for at least one said zone.

10. A method, including steps of defining a partial block of data from a block of data;

determining a set of zones within said block of data;

calculating a zone checksum value for each zone within said set of zones;

recording each said zone checksum value for each said zone in an array;

associating said array with said block;

combining the checksums within the array; and sending said block and a result of said steps of combining to a Network Interface Card (NIC).

11. A method as in claim 10 wherein combining includes a step of addition.

12. A method as in claim 10, further comprising the steps of calculating a partial zone checksum value for any partial zones contained in said partial block; and associating said partial zone checksum with said checksum array.

13. A method as in claim 10, including steps of receiving said partial block from an external device.

14. A method as in claim 13, wherein said external device is a Network Interface Card (NIC).

15. A method as in claim 13, wherein said external device is a storage medium.

16. A method as in claim 13, including steps of sending a pointer to said partial block and said checksum array from a first software element to a second software element.

17. A method as in claim 10, including steps of sending a pointer to said partial block and said checksum array from a first software element to a second software element.

18. A method as in claim 17, wherein said first software element and said second software element are associated with differing layers in a data transfer protocol.

19. An apparatus including memory including a block of data, said block being separable into a set of zones;

said memory including a zone checksum value for each said zone;

said memory including an association of said zone checksum values with each said zone;

memory including a combination of each said zone checksum values; and a Network Interface Card (NIC) that receives said block of data and said combination of said zone checksum values from said memory.

20. Apparatus as in claim 19, including memory including a partial zone checksum value for at least one said zones; and memory including a combination of said partial zone checksum value with said zone checksum value for at least one said zone.

21. Apparatus as in claim 19, wherein said memory includes at least one said partial zone for which to compute a partial zone checksum value;

said memory includes said partial zone checksum value associated with a selected portion of said partial zone; and said memory includes a combination of said partial zone checksum value with said zone checksum value for at least one said zone.

* * * * *